(12) United States Patent
Pickett et al.

(10) Patent No.: US 9,184,382 B2
(45) Date of Patent: Nov. 10, 2015

(54) MEMRISTIVE DEVICES WITH LAYERED JUNCTIONS AND METHODS FOR FABRICATING THE SAME

(75) Inventors: Matthew D. Pickett, San Francisco, CA (US); Jianhua Yang, Palo Alto, CA (US); Gilberto Medeiros Ribeiro, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 966 days.

(21) Appl. No.: 12/914,935

(22) Filed: Oct. 28, 2010

(65) Prior Publication Data

US 2012/0104345 A1 May 3, 2012

(51) Int. Cl.
*H01L 47/00* (2006.01)
*H01L 45/00* (2006.01)

(52) U.S. Cl.
CPC .............. *H01L 45/146* (2013.01); *H01L 45/06* (2013.01); *H01L 45/1233* (2013.01)

(58) Field of Classification Search
CPC ..................... H01L 23/53204; H01L 23/5228; H01L 45/04; H01L 27/24; H01L 23/5329; H01L 23/522
USPC ............... 257/2, 4, 5, 12, 90, 94, 96, 97, 101, 257/183, 750, 751, 752, 758, 759; 438/382, 438/605, 570, 571, 573
See application file for complete search history.

(56) References Cited

U.S. PATENT DOCUMENTS

| | | | |
|---|---|---|---|
| 7,544,398 B1 | 6/2009 | Chang et al. | |
| 8,471,234 B2 * | 6/2013 | Tong et al. | 257/4 |
| 2008/0054332 A1 | 3/2008 | Kim et al. | |
| 2008/0219039 A1 | 9/2008 | Kumar et al. | |
| 2009/0011145 A1 | 1/2009 | Yun et al. | |
| 2009/0065052 A1 * | 3/2009 | Sung | 136/256 |
| 2009/0208639 A1 | 8/2009 | Yun et al. | |
| 2009/0227067 A1 | 9/2009 | Kumar et al. | |
| 2010/0155686 A1 | 6/2010 | Bratkovski et al. | |
| 2010/0308302 A1 * | 12/2010 | Baldwin et al. | 257/14 |
| 2011/0051310 A1 * | 3/2011 | Strachan et al. | 361/281 |
| 2011/0121359 A1 * | 5/2011 | Yang et al. | 257/109 |
| 2011/0176353 A1 * | 7/2011 | Li et al. | 365/148 |
| 2011/0228592 A1 * | 9/2011 | Kamins et al. | 365/148 |
| 2011/0266510 A1 * | 11/2011 | Quitoriano et al. | 257/2 |
| 2012/0032134 A1 * | 2/2012 | Yang et al. | 257/4 |
| 2012/0133026 A1 * | 5/2012 | Yang et al. | 257/607 |
| 2013/0051121 A1 * | 2/2013 | Yang et al. | 365/148 |

OTHER PUBLICATIONS

Yang, Joshua, et al., "Memristive switching machanism for metal/oxide/metal nanodevices", Nature Nanotechnology 3, pp. 429-433, Jun. 15, 2008.

(Continued)

*Primary Examiner* — Thanh Y Tran
(74) *Attorney, Agent, or Firm* — Olympic Patent Works PLLC

(57) ABSTRACT

Memristor systems and method for fabricating memristor system are disclosed. In one aspect, a memristor includes a first electrode, a second electrode, and a junction disposed between the first electrode and the second electrode. The junction includes at least one layer such that each layer has a plurality of dopant sub-layers disposed between insulating sub-layers. The sub-layers are oriented substantially parallel to the first and second electrodes.

20 Claims, 9 Drawing Sheets

(56) References Cited

OTHER PUBLICATIONS

Tamura, Tomoyuki, et al., "First-principles study of the rectifying properties of Pt/TiO2 interface", American Physical Society, Phus. Rev. B80, 195302 Nov. 3, 2009.

Tsuchiya, Masaru, et al., "Photon-assisted oxidation and oxide thin film syntheses: A review", Harvard School of Engineering and Applied Sciences, Harvard University, May 6, 2009.

Strachan, John Paul, et al., "Direct Identification of Conducting Channels in functioning Memristive Device", Advanced Materials, vol. 22, Issue 32, pp. 3573-3577, Aug. 24, 2010.

Yang, J. Joshua, et al., "Diffusion of Adhesion Layer Metals Controls Nanoscale Memristive Switching", Advanced Materials, Jul. 30, 2010.

\* cited by examiner

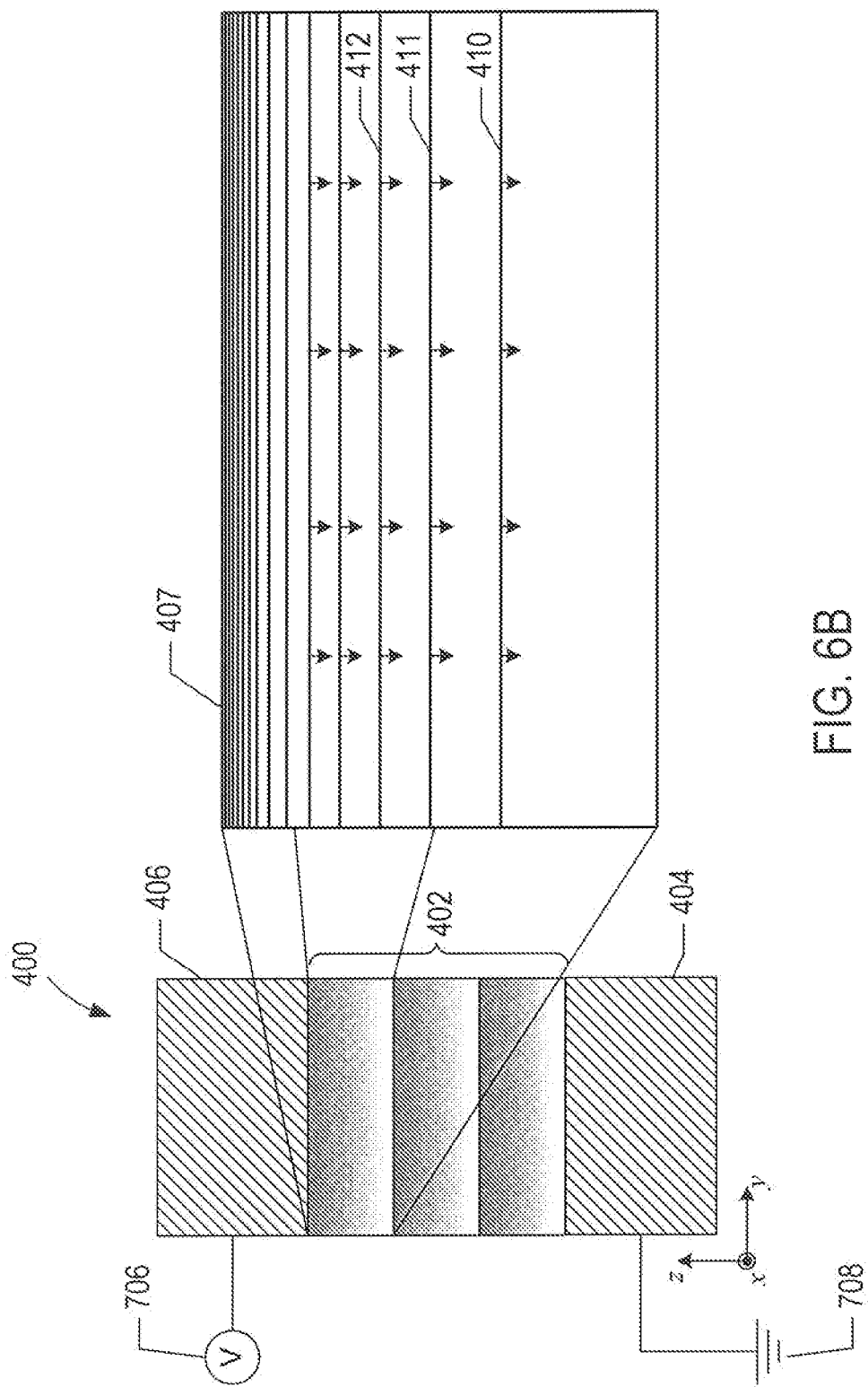

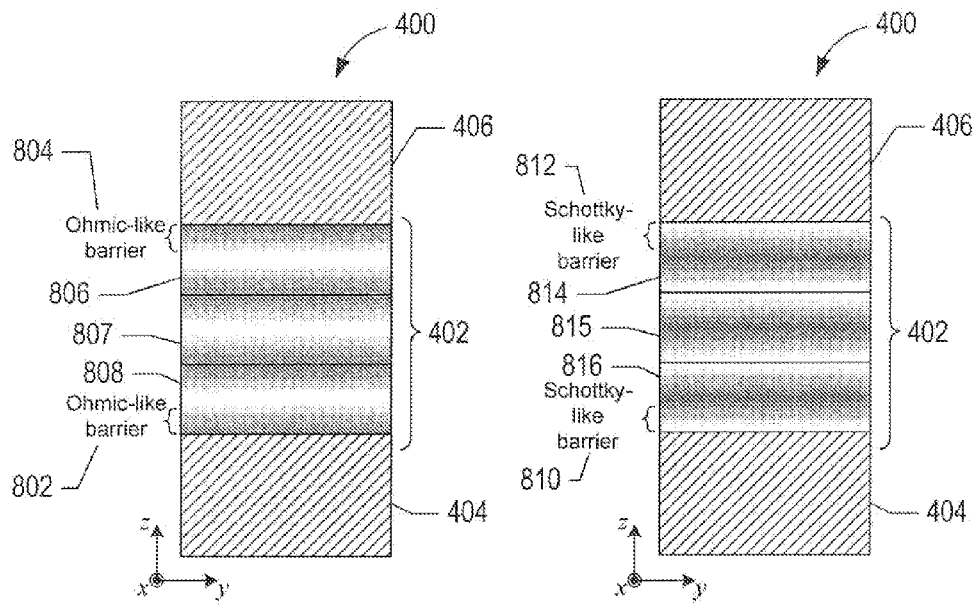
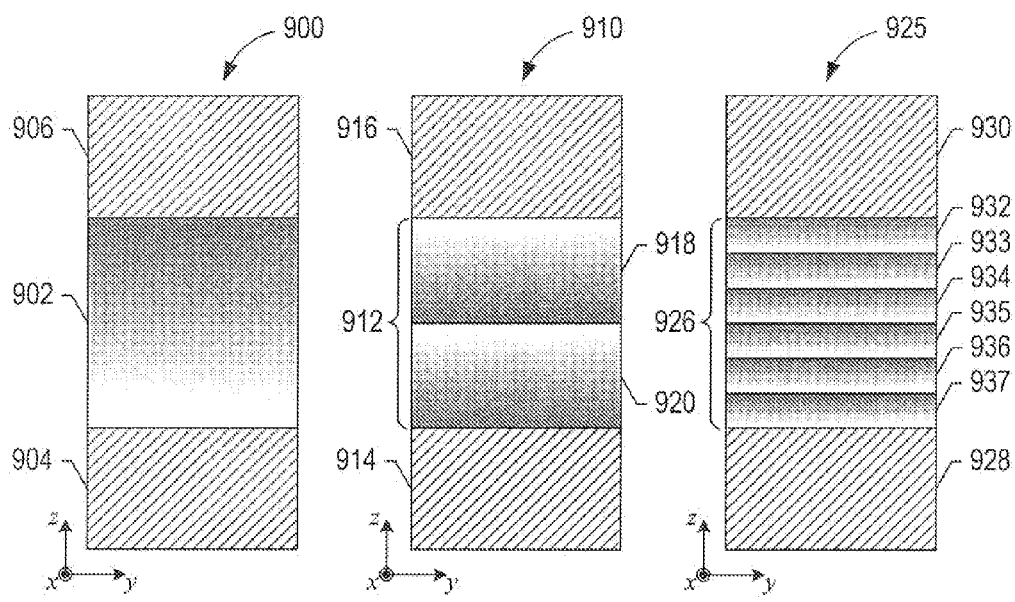
FIG. 8A   FIG. 8B
FIG. 9A   FIG. 9B   FIG. 9C

MEMRISTIVE DEVICES WITH LAYERED JUNCTIONS AND METHODS FOR FABRICATING THE SAME

TECHNICAL FIELD

This disclosure relates to memristive devices.

BACKGROUND

Significant research and development efforts are currently directed to designing and manufacturing nanoscale electronic devices. Nanoscale electronics promise significant advantages, including considerably reduced features sizes and the potential for self-assembly and for other relatively inexpensive, non-photolithography-based fabrication methods. However, the design and manufacture of nanoscale electronic devices present many new challenges when compared with the current state-of-the-art.

Studies of switching in nanoscale electronic devices have previously reported that these devices could be reversibly switched and had an "on-to-off" conductance ratio of approximately $10^4$. These nanoscale devices may be used to construct crossbar circuits and provide a promising route for the creation of ultra-high density memory. A series connection of crossbar switches that can be used to fabricate, for example, latch circuit elements has also been demonstrated, which is an important component for logic circuits and for communication between logic and memory. New logic families that can be constructed entirely from crossbar arrays of resistive switches or as hybrid structures composed of resistive switches and transistors have been described. These new logic families have the potential to dramatically increase the computing efficiency of CMOS circuits, thereby enabling performance improvements of orders of magnitude without having to shrink transistors, or to even replace CMOS for some applications if necessary. Because nanoscale electronic devices offer an abundance of potential advantages, engineers and physicists continue to seek improvements in the performance and manufacture of these devices.

BRIEF DESCRIPTION OF THE DRAWINGS

FIG. 6B shows a cross-sectional view of dopants within the dopant containing layers of the memristor, the dopants drifting as a result of a drift field.

FIG. 8A shows a cross-sectional view of a memristor configured as a shunted rectifier.

FIG. 8B shows a cross-sectional view of a memristor configured as a head-to-head rectifier.

FIGS. 9A-9C show cross-sectional views of three example memristor junctions.

DETAILED DESCRIPTION

This disclosure is directed to memristors composed of a pair of electrodes and a junction disposed between the two electrodes. The junction is formed from alternating insulating and dopant containing layers. This disclosure is also directed to atomic layer deposition methods for fabricating junctions in a layer-by-layer, stoichiometrically controlled manner enabling selection and control over the composition of each layer of the junction.

Figure 1:
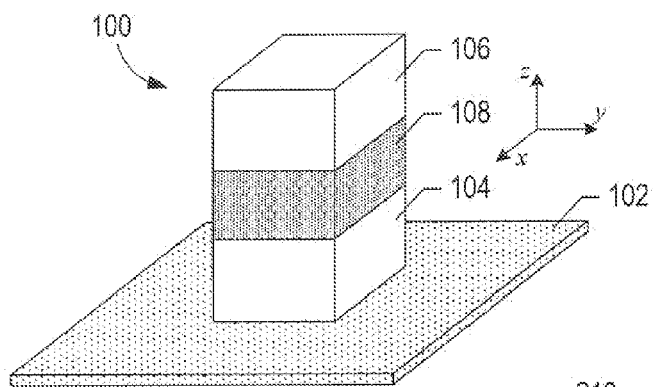
FIG. 1 shows an example of a memristor disposed on an insulating substrate.

FIG. 1 shows an example of a memristor 100 disposed on an insulating substrate 102. The memristor 100 includes a first electrode 104, a second electrode 106, and a junction 108 disposed between the electrodes 104 and 106. The junction 108 is composed of a nonvolatile material that can be switched between different resistance states when a voltage of an appropriate magnitude and polarity is applied to at least one of the electrodes 104 and 106.

Figure 2:
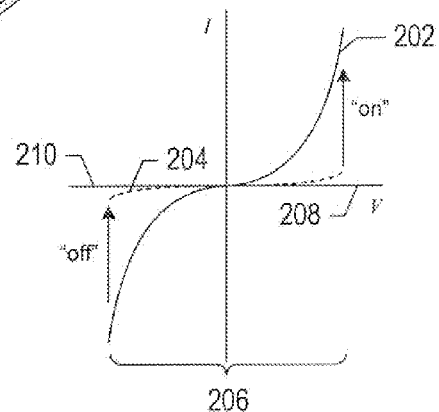
FIG. 2 shows an example current versus voltage plot for a typical nanoscale memristor.

Memristors can be used as resistive, analog memories that are capable of storing state information with very little decay for long periods of time, such as days, weeks, months, and possibly years. For example, a single bit can be stored in each memristor using the resistance state of the memristor. A high-resistance state can represent a logic "0" bit value, and a low-resistance state can represent a logic "1" bit value. FIG. 2 shows an example plot of current I versus voltage V for a typical nanoscale memristor. Solid curve 202 represents the current of the memristor in a low-resistance state, and dashed nonlinear curve 204 represents the memristor in a high-resistance state. Applying low magnitude voltages that fall within the voltage range 206 have negligible effect on changing the resistive state of the memristor and are used as operating voltages. On the other hand, applying larger magnitude voltages that fall outside the range 206 switches the memristor's resistance state. For example, applying a positive voltage greater than the positive "on" threshold 208 switches the memristor from the high-resistance state 204 into the low-resistance state 202, and applying a negative voltage less than the negative "off" threshold 210 switches the memristor from the low-resistive state 202 into the high-resistive state 204. The terms "positive" and "negative" refer to voltages with opposite polarities.

Figure 3:
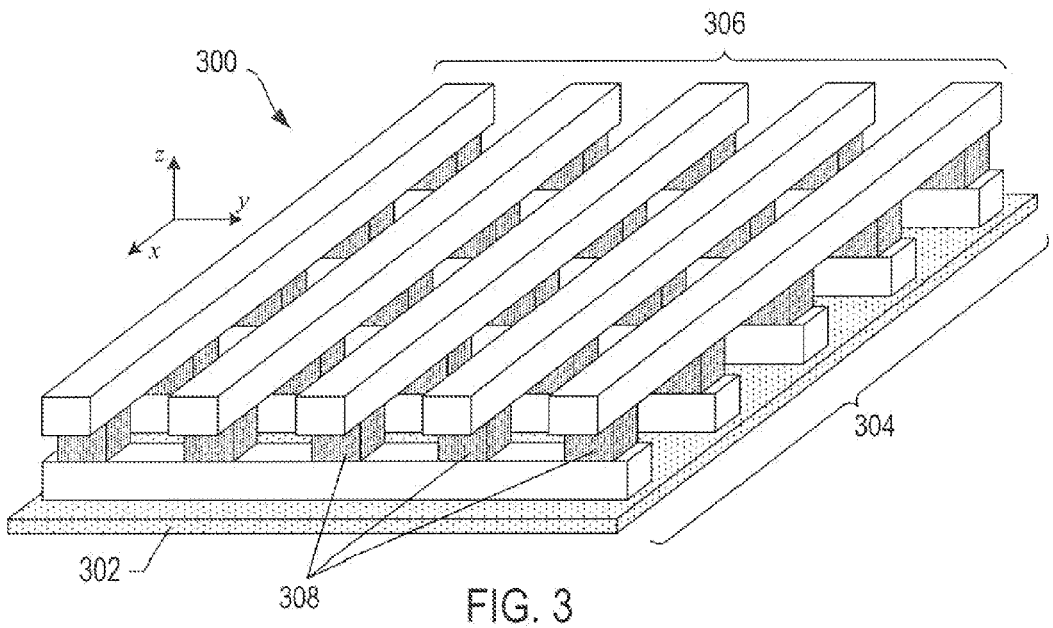
FIG. 3 shows an isometric view of an example crossbar array disposed on an insulating substrate.

Memristors can be implemented at the nanoscale or microscale in crossbar arrays as memristive crossbar junctions. FIG. 3 shows an isometric view of a crossbar array 300 disposed on an insulating substrate 302. The crossbar array 300 includes a first layer of approximately parallel nanowires 304 disposed on the substrate 302 and is overlain by a second layer of approximately parallel nanowires 306. In the example of FIG. 3, the nanowires of the second layer 306 are approximately perpendicular in orientation to the nanowires of the first layer 304, although in practice the orientation angle between the layers may vary. The two layers of nanowires form a lattice, or crossbar, where each nanowire of the second layer 306 overlays substantially all of the nanowires of the first layer 304 and comes into close contact with each nanowire of the first layer 304 at nanowire intersections that represent the closest contact between two nanowires. At each nanowire intersection, a junction is disposed between the two overlapping nanowires to form a memristive crossbar junction. For example, as shown in FIG. 3, junctions 308 form three memristive crossbar junctions.

Although the nanowires of the crossbar array 300 are shown with rectangular cross sections, nanowires can also have square, circular, elliptical, or more complex cross-sectional geometries. The nanowires may also have many different widths, diameters, aspect ratios, or eccentricities. The term "crossbar" may refer to crossbars having at least two layers of nanowires, sub-microscale wires, microscale wires, or wires with larger dimensions.

The junction 108 includes dopants that, depending on how the dopants are distributed, affect the resistance state of the memristor 100. The basic mode of operation of a memristor 100 is that when a voltage of an appropriate magnitude and polarity is applied to at least one of the electrodes 104 and 106 an electrical field, also called a "drift field," is generated across the junction 108. When the magnitude of the drift field exceeds a drift threshold, the dopants within the junction 108 become mobile and drift in and out of different sub-regions of the junction 108. For example, creating a drift field that drives dopants from a first sub-region into a second sub-region changes the resistance of the first and second sub-regions. The composition of the junction and dopants are selected so that dopant drift in or out of different sub-regions of the junction is possible but not too facile in order to prevent dopants from diffusing in or out of different regions of the junction when no voltage is applied. In other words, one potentially useful property of the junction 108 is that it can be a weak ionic conductor. The definition of a weak ionic conductor depends on the intended use of memristor 100. The mobility $\mu_d$ and the diffusion constant D of a dopant in a lattice material are related by Einstein's equation:

$$D = \mu_d kT$$

where k is Boltzmann's constant, and T is an absolute temperature. If the mobility $\mu_d$ of a dopant in a lattice is high so is the diffusion constant D. In general, it is desirable for the junction 108 of the memristor 100 to maintain a particular resistance state for an amount of time that may range from a fraction of a second to years, depending on the application. This is accomplished by selecting the junction 108 materials and dopants so that the dopant mobility $\mu_d$ and the diffusion constant D are small enough to ensure the stability or nonvolatility of the junction 108 for as long as necessary under the desired conditions. As a result, changes in the resistance state of the junction 108 that are due to ionized dopant diffusion can be avoided, and the resistance state of junction 108 can be intentionally set with an appropriate voltage. This ensures that the junction 108 is nonvolatile by retaining its resistance state even after the drift field has been removed. On the other hand, strongly ionic conductors have relatively larger dopant mobilities and may be unstable against diffusion. Note that this relation breaks down for high electric fields, which causes the mobility to become exponentially dependent on the field.

Figure 4:
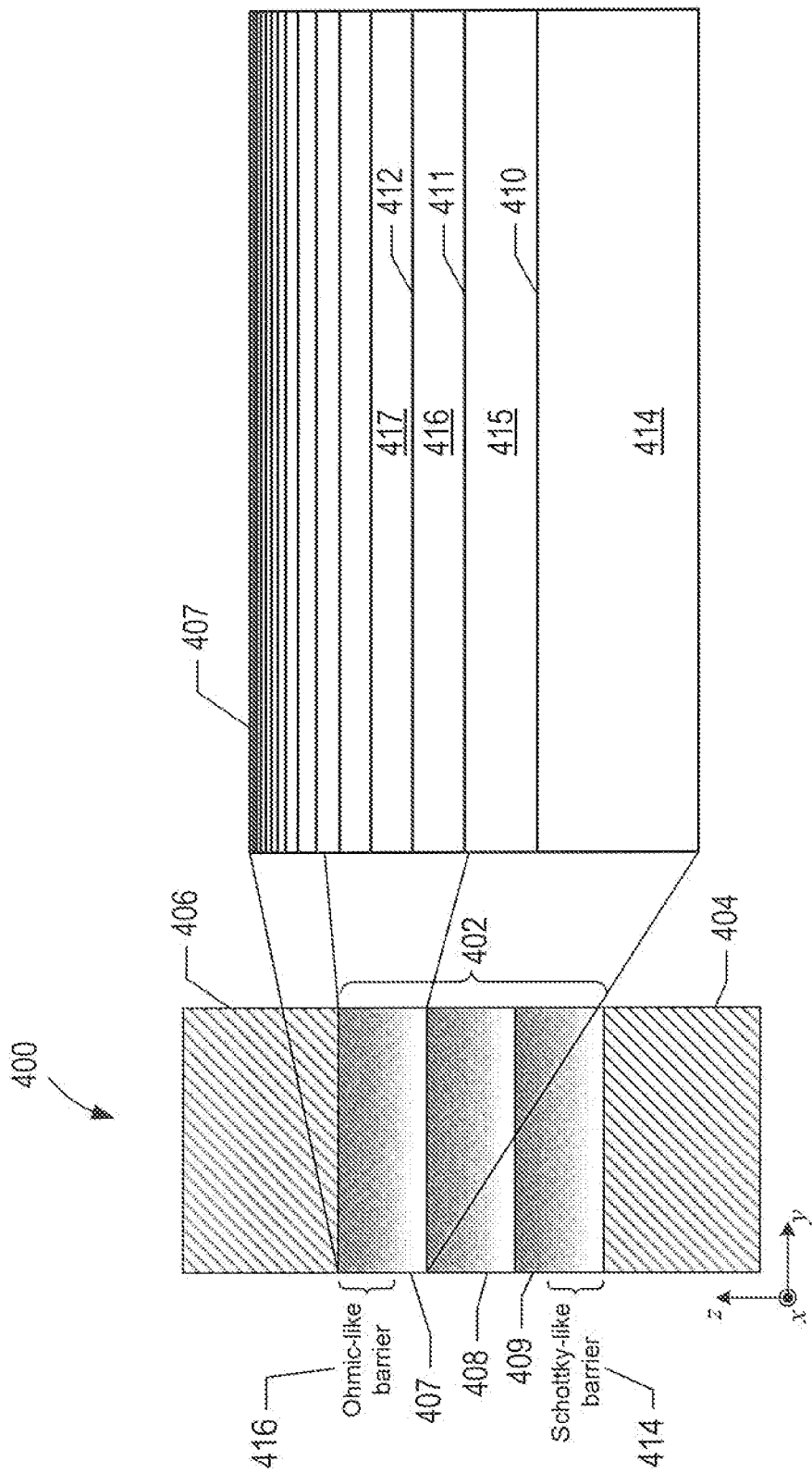
FIG. 4 shows a cross-sectional view of an example memristor.

Memristor embodiments are directed to memristors with layered junctions. FIG. 4 shows a cross-sectional view of an example memristor 400. The memristor 400 includes a junction 402 disposed between a first electrode 404 and a second electrode 406. The junction includes three layers 407-409, each of which has a graded dopant distribution in the z-direction represented by shaded and unshaded regions, where dark shaded regions of a layer represent a high dopant concentration and light shaded regions represent a low dopant concentration. In particular, each of the layers 407-409 has a graded distribution of dopants ranging from a low or no concentration of dopants near the first electrode 404 to a high concentration of dopants near the second electrode 406. FIG. 4 also includes an enlarged cross-sectional view of the layer 407 revealing how the dopants are concentrated in sub-layers oriented parallel to the xy-plane, such as dopant sub-layers 410-412, disposed between insulating sub-layers 414-417. For example, the dopant sub-layers of the layer 407 are spaced closer together in the z-direction toward the second electrode 406.

The electronic properties of undoped electrode/junction interfaces can electronically resemble Schottky barriers and are called "Schottky-like barriers," and the electronic properties of doped electrode/junction interfaces electronically resemble Ohmic barriers and are called "Ohmic-like barriers." As shown in the example of FIG. 4, the lower concentration of dopants located near the first electrode 404 creates a Schottky-like barrier 414 within the layer 409 adjacent to the first electrode 404, and the higher concentration of dopants located near the second electrode 406 creates an Ohmic-like barrier 416 within the layer 407 adjacent to the second electrode 406.

Figure 5A:
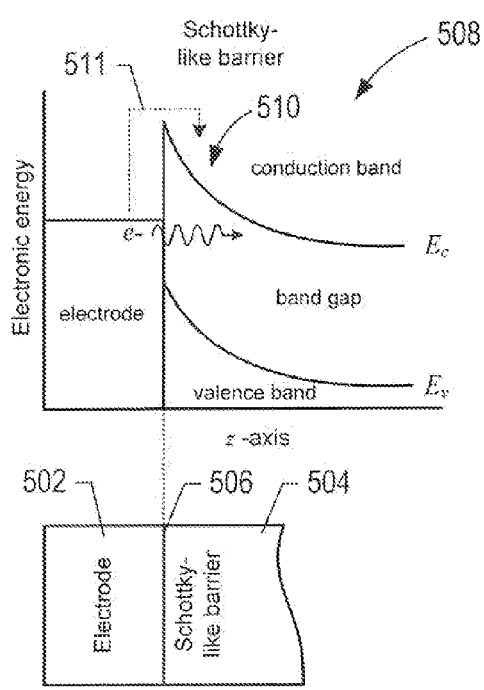
FIG. 5A shows an electronic band diagram that represents the electronic properties of a Schottky-like barrier at an electrode/junction interface of a memristor.

FIG. 5A shows an electronic band diagram 508 that represents the electronic properties of a Schottky-like barrier at an electrode 502/junction 504 interface 506. When the junction 504 near the electrode 502 has a low dopant concentration or is essentially intrinsic, the tunneling barrier is a Schottky-like barrier 510, which can be characterized as high and wide, effectively preventing electrons from tunneling from the electrode 502 into the conduction band of the junction 504, although, as shown in FIG. 5A, a small concentration of electrons 511 may have enough thermal energy to exceed the barrier and reach the conduction band. Thus, the conductivity through the junction 504 is low and the memristor interface is said to be in an "off" state.

Figure 5B:
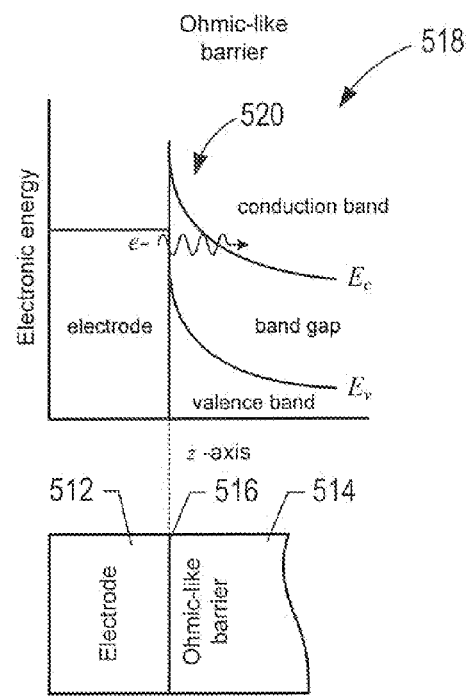
FIG. 5B shows an electronic band diagram that represents the electronic properties of an Ohmic-like barrier at an electrode/junction interface of a memristor.

On the other hand, FIG. 5B shows an electronic band diagram 518 that represents the electronic properties of an Ohmic-like barrier at an electrode 512/junction 514 interface 516. Band diagram 518 represents the case where a sufficient number of dopants are located within the junction 514 near the electrode 512. As a result, the tunneling barrier is an Ohmic-like barrier 520 where the width and the height of the tunneling barrier are lower than in the Schottky case, enabling electrons to tunnel from the electrode 512 into the conduction band of the junction 514, which results in an increase in conductivity, and the memristor interface is said to be in an "on" state.

Figure 6A:
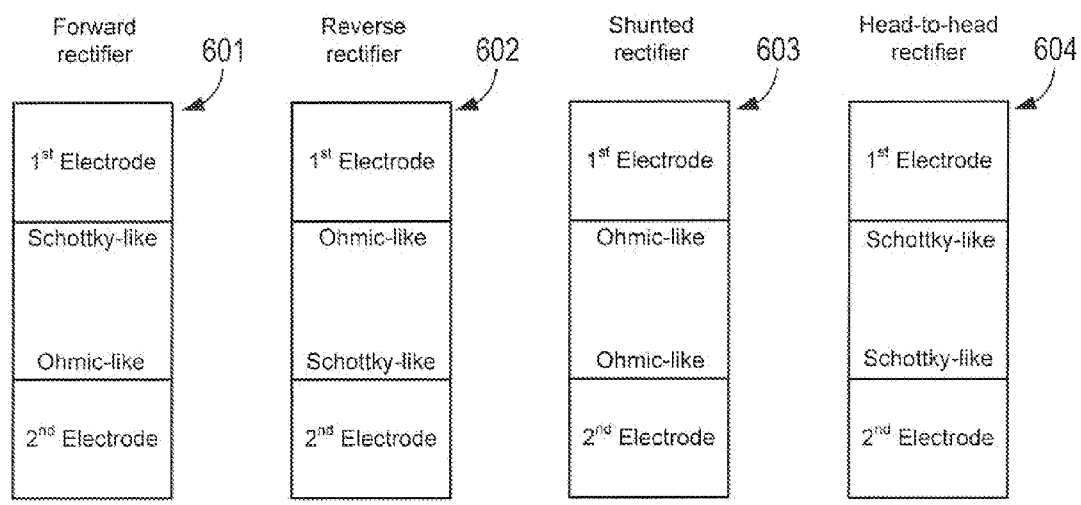
FIG. 6A shows the relative locations of Ohmic-like and Schottky-like barriers associated with four types of rectifiers that can be formed in a memristor.

FIG. 6A shows the relative locations of Ohmic-like and Schottky-like barriers associated with four types of rectifiers that can be formed in a memristor 100. A forward rectifier 601 and a reverse rectifier 602 have Ohmic-like barriers and Schottky-like barriers located at opposite interfaces. A shunted rectifier 603 is characterized by having dopants located at or near both interfaces creating Ohmic-like barriers at both interfaces. On the other hand, a head-to-head rectifier 604 is characterized by having the dopants distributed within the junction leaving Schottky-like barriers at both interfaces. Each of the four rectifiers represents a different distribution of dopants. Applying a voltage with an appropriate polarity and magnitude causes the dopants to drift, switching the memristor between the different rectifier states. The memristor can then be operated as a particular rectifier by applying voltages that do not exceed the voltage threshold used to switch the rectifier state.

FIG. 6B shows a cross-sectional view of dopants within the dopant containing layers of the memristor 400 drifting away from the second electrode 406 as a result of a drift field created by a voltage 606 and ground 608 applied to the electrodes 406 and 404, respectively. The drift field switches the memristor 400 from a reverse rectifier, shown in FIG. 4, to a different rectifier state, such as the forward rectifier state.

Figure 7:
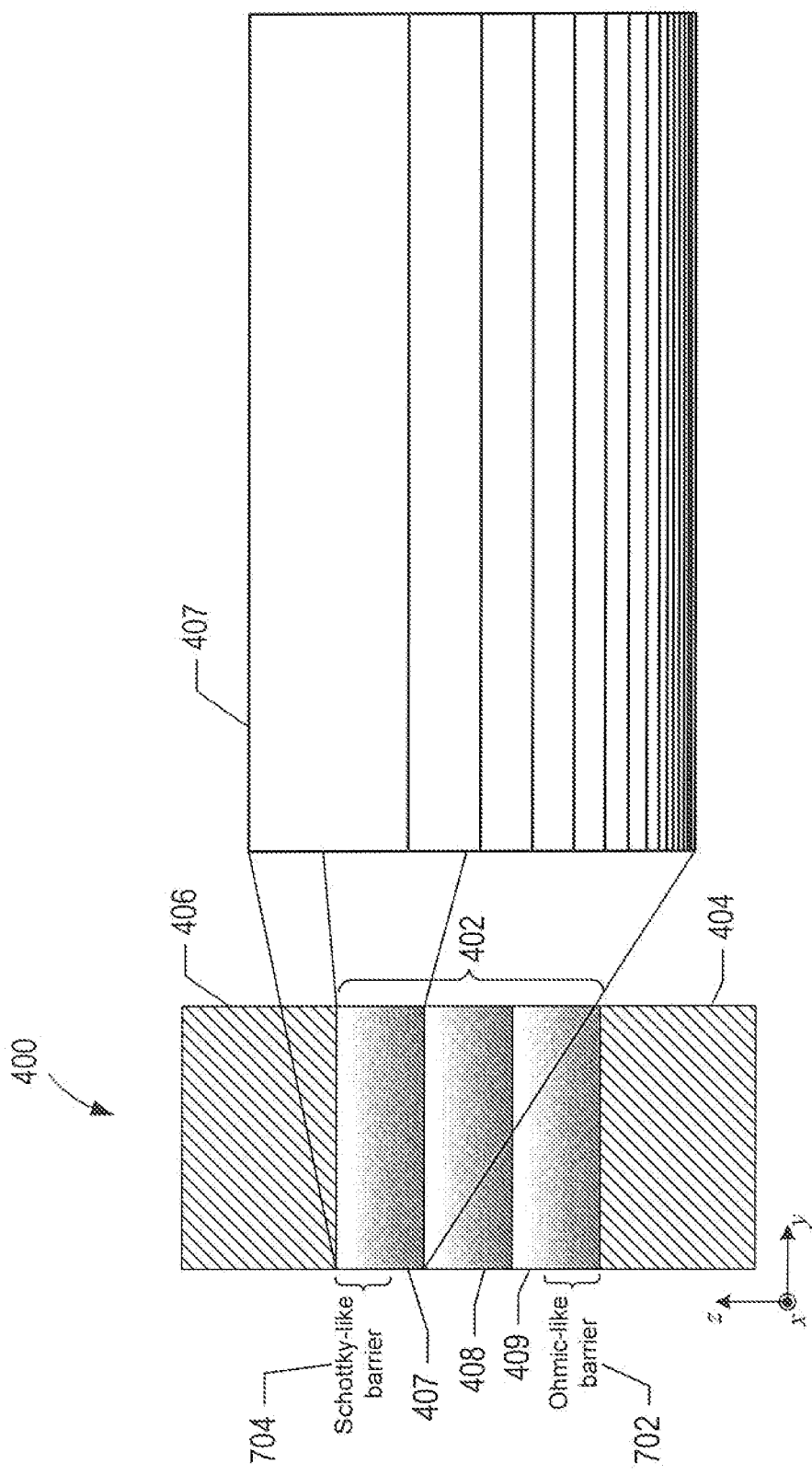
FIG. 7 shows a cross-sectional view of a memristor configured as a forward rectifier.

FIG. 7 shows a cross-sectional view of a memristor configured as a forward rectifier. In FIG. 7, the enlarged cross-sectional view of the layer 407 shows the dopant sub-layers spaced closer together in the z-direction toward the first electrode 404. Unlike the reverse rectifier shown in FIG. 4, the forward rectifier has a higher concentration of dopants located near the first electrode 404 creating an Ohmic-like barrier 702 within the layer 409 adjacent to the first electrode 404. The lower concentration of dopants located near the second electrode 406 creates a Schottky-like barrier 704 within the layer 407 adjacent to the second electrode 406.

FIG. 8A shows a cross-sectional view of the memristor 400 with the layers of the junction 402 arranged to create a shunted rectifier with Ohmic-like barriers 802 and 804 located adjacent to the electrodes 404 and 406, respectively. In this example of a shunted rectifier, each of the layers 806-808 has a graded distribution of dopants in the z-direction ranging from a low or no concentration of dopants near the center of each layer to a high concentration of dopants away from the center of each layer. The dopants are concentrated within dopant sub-layers oriented parallel to the xy-plane. The dopant sub-layers spaced closer together away from the center of each layer.

FIG. 8B shows a cross-sectional view of the memristor 400 with the layers of the junction 402 arranged to create a head-to-head rectifier with Schottky-like barriers 810 and 812 located adjacent to the electrodes 404 and 406, respectively. In this example of a head-to-head rectifier, each of the layers 814-816 has a graded distribution of dopants in the z-direction ranging from a high concentration of dopants near the center of each layer to a low or zero concentration of dopants away from the center of each layer. The dopants are concentrated within dopant sub-layers oriented parallel to the xy-plane. The dopant sub-layers are spaced closer together toward the center of each layer.

Memristors are not limited to a three-layer junction disposed between two electrodes. The number of layers comprising the junction can range from a single layer junction to a plurality of layers comprising the junction. FIGS. 9A-9C show cross-sectional views of three example memristor junctions. In FIG. 9A, a memristor 900 includes a junction 902 disposed between first and second electrodes 904 and 906. In this example, the junction 902 is formed of a single layer with dopants concentrated in dopant sub-layers oriented parallel to the xy-plane and are spaced closer together in the z-direction toward the second electrode 906. In FIG. 9B, a memristor 910 includes a junction 912 disposed between first and second electrodes 914 and 916. In this example, the junction 912 includes two layers 918-920, where each layer includes dopants concentrated in dopant sub-layers oriented parallel to the xy-plane. The dopant sub-layers of each layer are spaced closer together in the z-direction toward the first electrode 914. In FIG. 9C, a memristor 925 includes a junction 926 disposed between first and second electrodes 928 and 930. In this example, the junction 912 includes six layers 932-937. Each layer includes dopants concentrated in dopant sub-layers oriented parallel to the xy-plane. The dopant sub-layers of each layer are spaced closer together in the z-direction toward the second electrode 914.

The junction can be composed of various semiconductor materials in combination with a variety of different electrode materials. These combinations of materials provide a large materials engineering space from which memristors can be fabricated and are compatible with common CMOS devices.

Returning to FIG. 1, the junction 108 can be composed of a variety of different compounds; including but not limited to compounds with chemical formulas MA and $MA_2$, where M represents a cation selected from, but is not limited to, titanium ("Ti"), tantalum ("Ta"), silicon ("Si"), zirconium ("Zr"), nickel ("Ni"), hafnium ("Hf"), niobium ("Nb"), chromium ("Cr"), tungsten ("W"), vanadium ("V"), manganese ("Mn"), copper ("Cu"), and iron ("Fe"); and A represents an anion selected from, but not limited to, oxygen ("O"), nitrogen ("N"), phosphorus ("P"), and sulfur ("S"). The dopant is an anion vacancy formed in the dopant sub-layers of the junction. For example, consider the memristor 400 shown in FIG. 4, the dopant sub-layers, such as dopant sub-layers 410-412, are composed of Ti and the insulating sub-layers 414-417 are composed of $TiO_2$. In this example, the dopant sub-layers are a source of O vacancies that effectively act as n-type mobile dopants that drift within the $TiO_2$ insulating sub-layers when the junction 402 is subjected to a drift field. As another example, consider the memristor 400 with the dopant sub-layers composed Zr and the insulating sub-layers 414-417 composed of $ZrN_2$. In this example, the dopant sub-layers are a source of N vacancies that also effectively act as n-type mobile dopants within the $ZrN_2$ insulating sub-layers when the junction 402 is subjected to a drift field.

The electrodes 104 and 106 of the memristor 100 can be composed of platinum ("Pt"), gold ("Au"), copper ("Cu"), tungsten ("W"), or any other suitable metal, metallic compound, or doped semiconductor. The electrodes 104 and 106 can also be composed of metallic oxides or nitrides, such as $RuO_2$, $IrO_2$, and TiN or any suitable combination of these materials. For example, the first electrode 104 can be composed of Cu and the second electrode 106 can be composed Au. Also, the first electrode 104 can be composed of Pt and the second electrode 106 can be composed of a doped semiconductor.

Atomic layer deposition ("ALD") can be used to form the layers and sub-layers of a junction in a stoichiometrically controlled manner. ALD is a thin film deposition technique based on the sequential use of a gas phase chemical process. ALD reactions typically use two chemical reactants called precursors. These precursors react with a surface one-at-a-time in a sequential manner. By exposing the precursors to the growth surface repeatedly, the precursors react to form the layers and sub-layers of a junction. ALD is a surface-limiting process because the amount of material deposited in each reaction cycle is constant and layers are formed sequentially by depositing conformal thin-films of reactant materials. ALD is typically performed in two half-reaction stages, keeping the precursor materials separate during each reaction. The material layers are grown using ALD by repeating four stages: (1) A surface is exposed to the first precursor in a reaction chamber that deposits a film of the first precursor on the surface; (2) The reaction chamber is purged or evacuated to remove any non-reacted first precursor and by-products; (3) The first precursor attached to the surface is exposed to the second precursor, which reacts with the first precursor to form the desired material film or layer of material. (4) The reaction chamber is again purged or evacuated to remove the non-reacted second precursor and any by-products. Stages (1)-(4) are repeated until a desired layer thickness is achieved.

Figure 10:
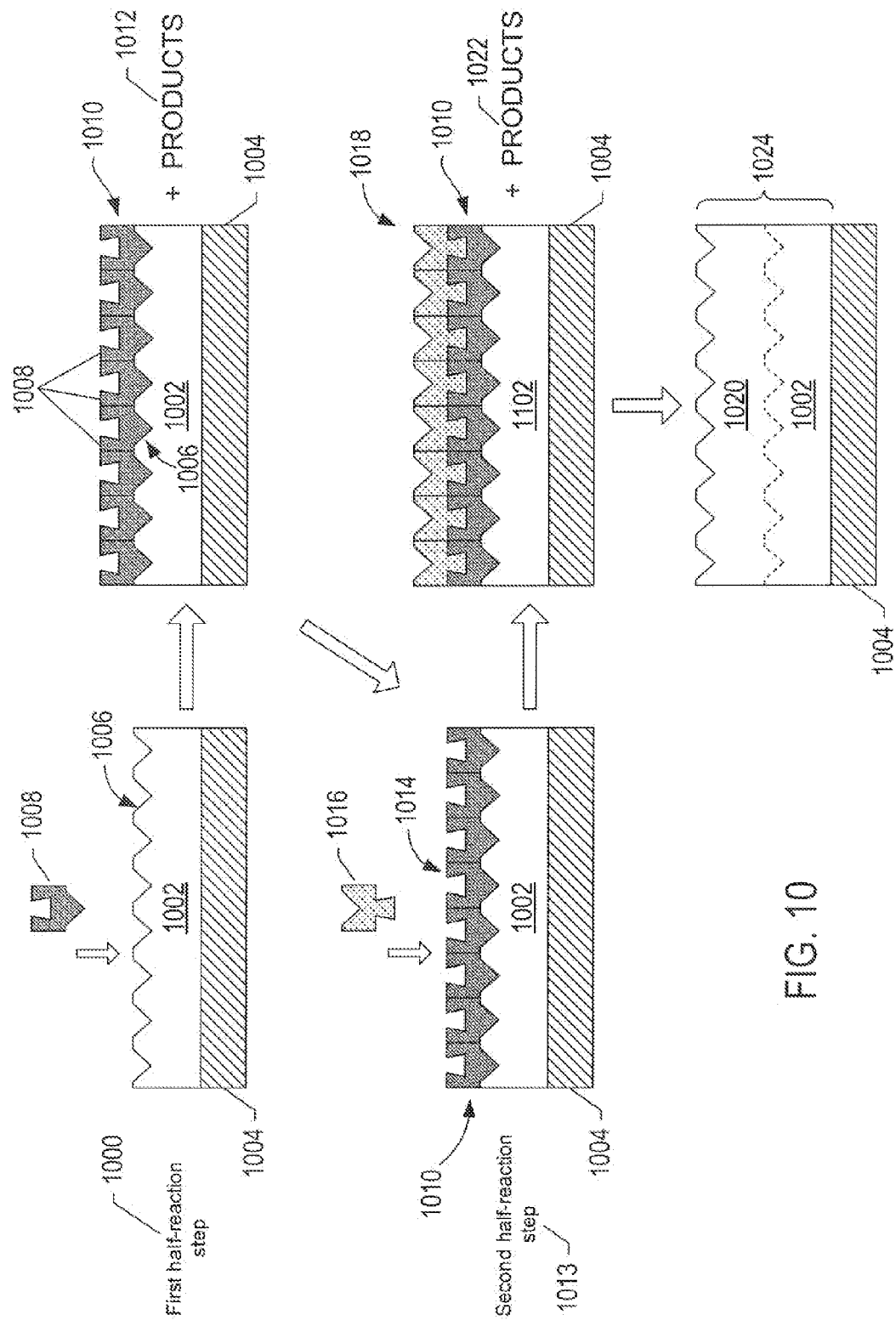
FIG. 10 shows an example of using atomic layer deposition to form an insulating sub-layer of a junction.

Fabrication of the insulating and dopant sub-layers of the junction described above with reference to FIGS. 4 and 6 are now described with reference to FIGS. 10 and 11. In this example, the junction composed of the materials $TiO_2$ and Ti. FIG. 10 shows an example of using ALD to form a $TiO_2$ insulating sub-layer of a junction. In a reaction chamber (not shown), a portion 1002 of a $TiO_2$ layer is disposed on a surface of an electrode 1004. In a first half-reaction stage 1000, the surface 1006 is exposed to a first precursor $TiCl_4$ 1008 in the reaction chamber. The $TiCl_4$ precursor 1008 forms a conformal film 1010 with a substantially uniform thickness along the surface 1006. After sufficient time for the conformal film 1010 has elapsed, products 1012 composed of non-reacted $TiCl_4$ 1003 and other by-products produced in the reaction chamber are evacuated. In a' second half-reaction stage 1013, the surface 1014 of the $TiCl_4$ precursor film 1010 is exposed to a second precursor $H_2O$ 1016 in the same reaction chamber. The $H_2O$ precursors 1016 that contact 1018 the $TiO_4$ precursor film 1010 react according to the chemical reaction

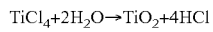

to form a conformal film of $TiO_2$ 1020 on the $TiO_2$ portion 1002. Products 1022 composed of non-reacted $H_2O$ 1016 and other by-products, such as HCl gas, are evacuated from the reaction chamber leaving a thicker layer of $TiO_2$ 1024. The first and second half-reaction stages 1000 and 1013 comprise a single oxidation reaction cycle that can be repeated to grow the $TiO_2$ layer to a desired thickness. Note that the portion 1002 can also be formed on the electrode 1004 using the oxidation reduction cycle.

Figure 11:
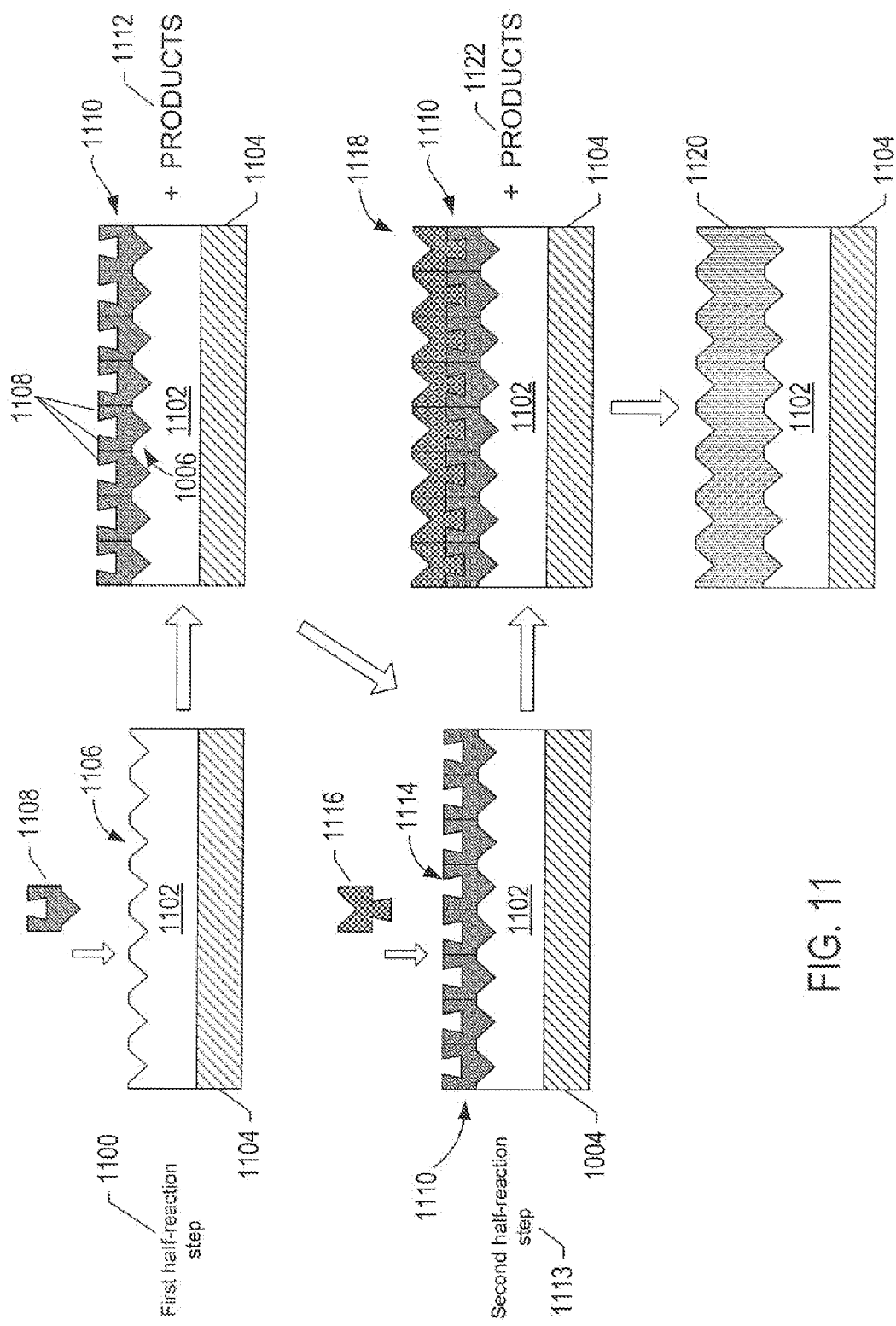
FIG. 11 shows an example of using atomic layer deposition to form a dopant sub-layer of a junction.

FIG. 11 shows an example of using ALD to form a Ti dopant sub-layers on a $TiO_2$ layer of a junction. In a reaction chamber (not shown), a portion 1102 of a $TiO_2$ layer is disposed on a surface of an electrode 1004. The portion 1102 can be formed using ALD as described above with reference to FIG. 10. A Ti dopant sub-layer can be formed in nearly the same manner as the $TiO_2$ layer described above with the same first half-reaction stage 1100 in which the surface 1106 is exposed to a first precursor $TiCl_4$ 1108 to form a conformal film 1110 with a substantially uniform thickness on the surface 1106. After sufficient time for deposition of the conformal film 1110 has elapsed, products 1112 composed of non-reacted $TiCl_4$ 1103 and other by-products produced in the reaction chamber are evacuated. In a second half-reaction stage 1113, the surface 1114 of the $TiCl_4$ precursor film 1110 is exposed to a second precursor $H_2$ 1116 in the same reaction chamber. The $H_2$ precursors 1016 that contact 1118 the $TiO_4$ precursor film 1110 react according to the chemical reaction

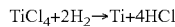

to form a conformal film or layer of Ti 1120 on the $TiO_2$ portion 1102. Products 1122 composed of non-reacted $H_2$ 1116 and other by-products, such as HCl gas, are evacuated from the reaction chamber leaving the Ti dopant sub-layer 1120 deposited on the $TiO_2$ portion 1102. The first and second half-reaction stages 1100 and 1113 comprise a single reduction reaction cycle that can be repeated to grow the Ti layer to a desired thickness. A second layer of $TiO_2$ can be formed over the Ti layer 1120 to a desired thickness by repeatedly applying the oxidation cycle described above with reference to FIG. 10. As a result, the Ti dopant sub-layer 1120 becomes a source of oxygen vacancy dopants.

Methods of fabricating a junction composed $TiO_2$ and Ti layers are not limited to a tetrachloride first precursor $TiCl_4$. Other first precursors can be used, such as titanium isopropoxide ($Ti\{OCH(CH_3)_2\}_4$).

Figure 12:
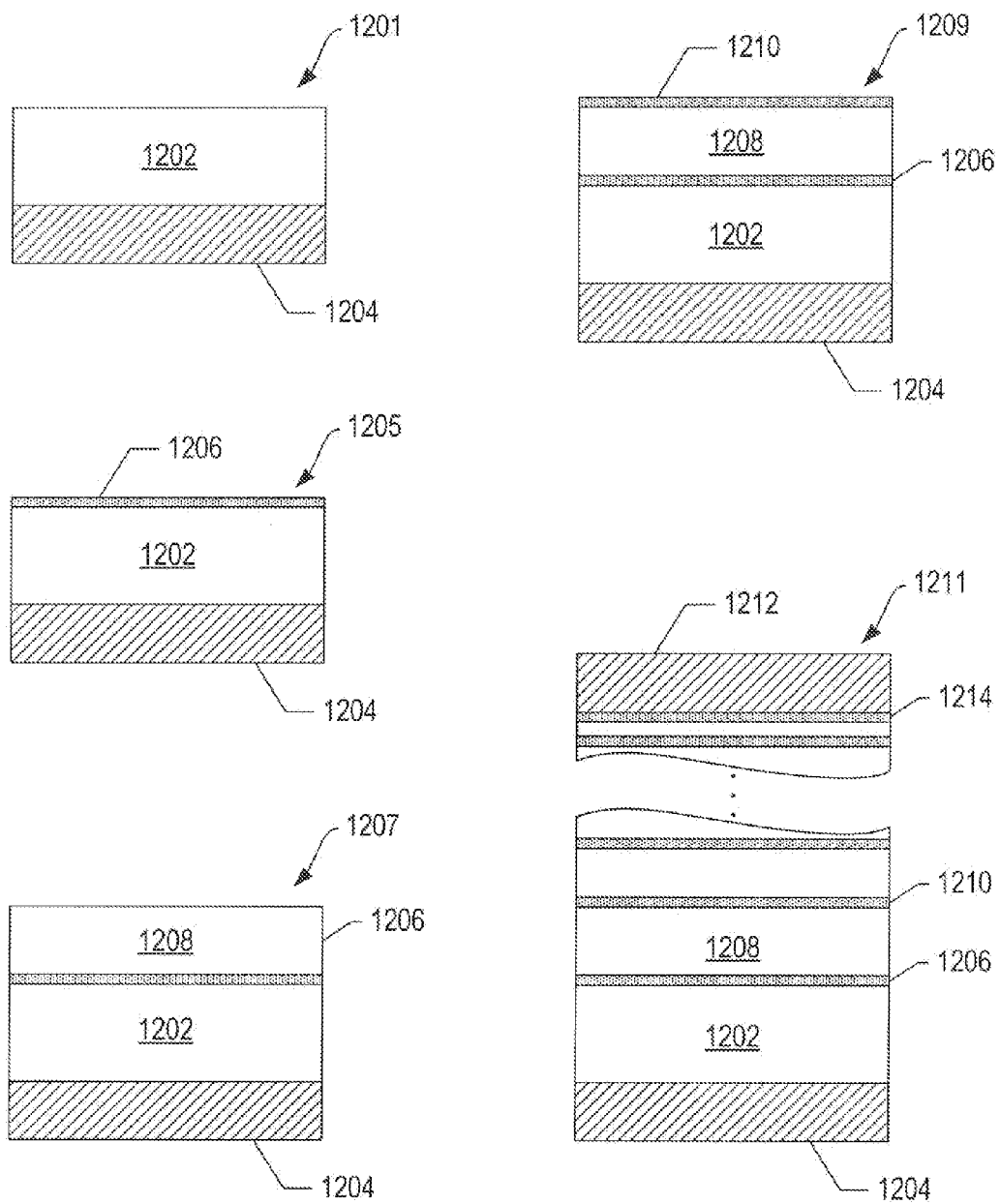
FIG. 12 shows cross-sectional views of forming a junction of a memristor.

FIG. 12 shows cross-sectional views of sublayer-by-sublayer formation of a junction of a memristor using the oxidation and reduction cycles described above with reference to FIGS. 10 and 11. In stage 1201, the oxidation cycle is repeated to form an insulating sub-layer 1202 to a desired thickness on an electrode 1204. The electrode can be formed on an insulating substrate (not shown) using chemical vapor deposition, physical vapor deposition, or electroplating. In stage 1205, the reduction cycle is repeated to form a dopant sub-layer 1206 to, a desired thickness on the surface of the insulating sub-layer 1202. In stage 1207, the oxidation cycle is repeated to form an insulating sub-layer 1208 to a desired thickness on the dopant sub-layer 1206. However, the oxidation cycle in this stage is, repeated fewer times to form the insulating sub-layer 1208 to a thickness that is less than the thickness of the insulating sub-layer 1202. In stage 1209, the reduction cycle is repeated to form a dopant sub-layer 1210 to a desired thickness on the surface of the insulating sub-layer 1202. The oxidation and reductions cycles are used to form alternating insulating and dopant sub-layers of a layer of a junction. In stage 1211, when the junction is formed to a desired thickness with a desired number of layers, an electrode 1212 is deposited on the surface of a dopant sub-layer 1214 using chemical vapor deposition.

The foregoing description, for purposes of explanation, used specific nomenclature to provide a thorough understanding of the disclosure. However, it will be apparent to one skilled in the art that the specific details are not required in order to practice the systems and methods described herein. The foregoing descriptions of specific embodiments are presented for purposes of illustration and description. They are not intended to be exhaustive of or to limit this disclosure to the precise forms described. Obviously, many modifications and variations are possible in view of the above teachings. The embodiments are shown and described in order to best explain the principles of this disclosure and practical applications, to thereby enable others skilled in the art to best utilize this disclosure and various embodiments with various modifications as are suited to the particular use contemplated. It is intended that the scope of this disclosure be defined by the following claims and their equivalents.

The invention claimed is:

1. A memristor comprising:
a first electrode;
a second electrode; and
a junction disposed between the first and second electrodes,
wherein the junction includes at least one layer, each layer having a plurality of dopant sub-layers disposed between insulating sub-layers with an insulating sub-layer between each pair of dopant sub-layers, each dopant sub-layer comprising mobile dopants.

2. The memristor of claim 1, wherein the dopant sub-layers are substantially planar and substantially parallel to one another.

3. The memristor of claim 1, wherein the plurality of dopant sub-layers disposed between insulating sub-layers further comprises the insulating sub-layers varying in thickness such that the dopant sub-layers in each layer are spaced closer together toward the first electrode.

4. The memristor of claim 1, wherein the plurality of dopant sub-layers disposed between insulating sub-layers further comprises the insulating sub-layers varying in thickness such that the dopant sub-layers are spaced closer together toward the center of each layer.

5. The memristor of claim 1, wherein the plurality of dopant sub-layers disposed between insulating sub-layers further comprises the insulating sub-layers varying in thickness such that the dopant sub-layers in each layer are spaced farther apart toward the center of each layer.

6. The memristor of claim 1, wherein the plurality of dopant sub-layers disposed between insulating sub-layers further comprises a Schottky-like barrier formed from dopant sub-layers within a layer of the junction located adjacent to one of the electrodes.

7. The memristor of claim 1, wherein the plurality of dopant sub-layers disposed between insulating sub-layers further comprises an Ohmic-like barrier formed from insulating sub-layers within a layer of the junction located adjacent to one of the electrodes.

8. A method for forming the memristor of claim 1, comprising
a first electrode;
a second electrode; and
a junction disposed between the first and second electrodes, wherein the junction includes at least one layer, each layer having a plurality of dopant sub-layers disposed between insulating sub-layers, the sub-layers oriented substantially parallel to the first and second electrodes;
said method comprising:
forming the first electrode on a surface of an insulating substrate, the first electrode having first and second substantially parallel surfaces, the second surface disposed adjacent to the surface of the insulating substrate;
forming the junction on the first surface of the electrode, the junction includes at least one layer having a plurality of insulating sub-layers and dopant sub-layers, each dopant sub-layer disposed between two insulating sub-layers, the sub-layers formed substantially parallel to the first surface of the first electrode; and
forming the second electrode on the junction.

9. The method of claim 8, wherein forming the at least one layer of the junction further comprises alternately forming the insulating and dopant sub-layers using atomic layer deposition.

10. The method of claim 8, wherein forming the at least one layer of the junction further comprises forming each insulating sub-layer such that the dopant sub-layers are spaced farther apart toward the center of the layer.

11. The method of claim 8, wherein forming the at least one layer of the junction further comprises forming each insulating sub-layer such that the dopant sub-layers are spaced closer together toward the center of the layer.

12. The method of claim 8, wherein forming the at least one layer of the junction further comprises forming each insulating sub-layer such that the dopant sub-layers are spaced closer together toward the first electrode.

13. A crossbar array comprising:
a first layer of approximately parallel wires;
a second layer of approximately parallel wires overlaying the first layer, wherein each wire of the second layer overlays substantially all of the wires of the first layer; and
a junction disposed between each pair of overlapping wires, wherein said overlapping wires serve, respectively, as first and second electrodes disposed on opposite ends of the corresponding junction, and wherein each junction includes at least one layer, each layer having a plurality of dopant sub-layers with an insulating sub-layer disposed between each pair of dopant sub-layers, each dopant sub-layer comprising mobile dopants.

14. The crossbar of claim 13, wherein the junction disposed between each pair of overlapping wires further comprises a memristor.

15. The crossbar of claim 14, wherein the dopant sub-layers are substantially planar and substantially parallel to one another.

16. The crossbar of claim 14, wherein the plurality of dopant sub-layers disposed between insulating sub-layers further comprises the insulating sub-layers varying in thickness such that the dopant sub-layers in each layer are spaced closer together toward the first layer of wires.

17. The crossbar of claim 14, wherein the plurality of dopant sub-layers disposed between insulating sub-layers further comprises the insulating sub-layers varying in thickness such that the dopant sub-layers are spaced closer together toward the center of each layer.

18. The crossbar of claim 14, wherein the plurality of dopant sub-layers disposed between insulating sub-layers further comprises the insulating sub-layers varying in thickness such that the dopant sub-layers in each layer are spaced farther apart toward the center of each layer.

19. The crossbar of claim 14, wherein the plurality of dopant sub-layers disposed between insulating sub-layers further comprises a Schottky-like barrier formed from dopant sub-layers within a layer of the junction located adjacent to one of the overlapping wires.

20. The crossbar of claim 14, wherein the plurality of dopant sub-layers disposed between insulating sub-layers further comprises an Ohmic-like barrier formed from insulating sub-layers within a layer of the junction located adjacent to one of the overlapping wires.

* * * * *